United States Patent
Nie et al.

(10) Patent No.: US 11,311,967 B2
(45) Date of Patent: *Apr. 26, 2022

(54) SAPPHIRE COLLECTOR FOR REDUCING MECHANICAL DAMAGE DURING DIE LEVEL LASER LIFT-OFF

(71) Applicant: Lumileds LLC, San Jose, CA (US)

(72) Inventors: Dong Nie, Singapore (SG); Kian-Hock Tee, Singapore (SG)

(73) Assignee: Lumileds LLC, San Jose, CA (US)

( * ) Notice: Subject to any disclaimer, the term of this patent is extended or adjusted under 35 U.S.C. 154(b) by 1297 days.

This patent is subject to a terminal disclaimer.

(21) Appl. No.: 15/504,796

(22) PCT Filed: Jul. 29, 2015

(86) PCT No.: PCT/IB2015/055712
§ 371 (c)(1),
(2) Date: Feb. 17, 2017

(87) PCT Pub. No.: WO2016/027186
PCT Pub. Date: Feb. 25, 2016

(65) Prior Publication Data
US 2017/0274474 A1 Sep. 28, 2017

Related U.S. Application Data

(60) Provisional application No. 62/038,988, filed on Aug. 19, 2014.

(51) Int. Cl.
*H01L 33/00* (2010.01)
*B23K 26/00* (2014.01)
(Continued)

(52) U.S. Cl.
CPC ........ *B23K 26/142* (2015.10); *B23K 26/0006* (2013.01); *B23K 26/0622* (2015.10);
(Continued)

(58) Field of Classification Search
CPC .............. B23K 26/0006; B23K 26/142; B23K 26/356; B23K 26/0622; B23K 2103/50;
(Continued)

(56) References Cited

U.S. PATENT DOCUMENTS 3,482,755 A * 12/1969 Raciti ................. B23K 3/0653
228/34
3,626,141 A * 12/1971 Daly ...................... B23K 26/16
219/121.68
(Continued)

FOREIGN PATENT DOCUMENTS

EP 1433563 A2 6/2004
JP 10-113786 A 5/1998
(Continued)

OTHER PUBLICATIONS

EPO as ISA, "International Search Report and Written Opinion" dated Oct. 23, 2015 from International Application No. PCT/IB2015/055712, filed Jul. 29, 2015, 13 pages.
(Continued)

*Primary Examiner* — Eric S Stapleton
(74) *Attorney, Agent, or Firm* — Volpe Koenig

(57) ABSTRACT

In a Sapphire Collector (SC), one or more features, both structural and parametric, are included for capturing the die-size sapphire chips that are removed from a semiconductor structure during die-level laser lift-off (LLO). These features are designed to increase the likelihood that each sapphire chip is securely captured by the Sapphire Collector immediately after it is released from the semiconductor structure. The Sapphire Collector includes a vacuum-enhance collector with a pickup element that lifts each released chip into the collector, and air pushers that direct the chips further into the collection tunnel leading to a discard bin.

20 Claims, 3 Drawing Sheets

(51) Int. Cl.
  *B23K 26/70* (2014.01)
  *H01L 21/78* (2006.01)
  *B23K 26/142* (2014.01)
  *B23K 26/0622* (2014.01)
  *B23K 26/356* (2014.01)
  *B23K 101/42* (2006.01)
  *B23K 103/16* (2006.01)
  *B23K 101/40* (2006.01)
  *B23K 103/00* (2006.01)

(52) U.S. Cl.
  CPC ........ *B23K 26/356* (2015.10); *B23K 2101/40* (2018.08); *B23K 2101/42* (2018.08); *B23K 2103/172* (2018.08); *B23K 2103/50* (2018.08); *H01L 33/0093* (2020.05)

(58) Field of Classification Search
  CPC ............ B23K 2101/42; B23K 2101/40; B23K 2103/172; H01L 33/0079
  USPC ..................................................... 219/121.84
  See application file for complete search history.

(56) References Cited

U.S. PATENT DOCUMENTS

| | | | |
|---|---|---|---|
| 3,866,398 A * | 2/1975 | Vernon, Jr. | B23K 26/142 134/1.3 |
| 4,166,761 A * | 9/1979 | Aloupis | G21B 1/23 376/140 |
| 4,315,133 A * | 2/1982 | Morgan | B23K 26/1488 219/121.84 |
| 4,361,957 A * | 12/1982 | Krotz | B08B 15/04 227/156 |
| 4,439,012 A * | 3/1984 | Christy | G02B 17/0694 359/859 |
| 4,837,443 A * | 6/1989 | Young | G03F 7/70866 250/440.11 |
| 4,897,520 A * | 1/1990 | Carter | B08B 15/04 219/121.68 |
| 5,237,150 A * | 8/1993 | Karube | B23K 26/0643 219/121.72 |
| 5,317,589 A * | 5/1994 | Ogawa | H01S 3/0818 372/101 |
| 5,359,176 A * | 10/1994 | Balliet, Jr. | B23K 26/1476 219/121.67 |
| 5,425,812 A * | 6/1995 | Tsutahara | C23C 16/4412 118/715 |
| 5,504,301 A * | 4/1996 | Eveland | B23K 26/18 219/121.67 |
| 5,570,384 A * | 10/1996 | Nishida | B23K 26/032 372/19 |
| 5,598,965 A * | 2/1997 | Scheu | B23K 1/018 228/6.2 |
| 5,662,762 A * | 9/1997 | Ranalli | B08B 7/0042 156/707 |
| 5,728,993 A * | 3/1998 | O'Neill | B23K 26/0604 219/121.67 |
| 5,770,095 A * | 6/1998 | Sasaki | C23F 3/00 216/38 |
| 5,780,806 A * | 7/1998 | Ferguson | B08B 7/0042 134/1 |
| 5,906,760 A * | 5/1999 | Robb | B08B 15/00 219/121.67 |
| 5,925,024 A * | 7/1999 | Joffe | A61B 18/00 604/313 |
| 5,973,764 A * | 10/1999 | McCullough | G03F 7/70241 355/30 |
| 5,981,901 A * | 11/1999 | La Rocca | B23K 26/123 219/121.63 |
| 6,034,343 A * | 3/2000 | Hashimoto | B23K 26/348 219/74 |
| 6,120,360 A * | 9/2000 | Ball | B28D 5/0082 257/E21.505 |
| 6,201,278 B1 * | 3/2001 | Gardner | H01L 29/66621 257/330 |
| 6,261,859 B1 * | 7/2001 | Ouchi | H01L 33/0093 438/39 |
| 6,274,399 B1 * | 8/2001 | Kern | H01L 33/12 438/22 |
| 6,294,754 B1 * | 9/2001 | Nagura | B23K 26/0604 219/121.63 |
| 6,440,254 B1 * | 8/2002 | Rich | B29C 66/002 156/272.2 |
| 6,491,204 B1 * | 12/2002 | Erdmann | B23K 1/018 228/22 |
| 6,494,965 B1 * | 12/2002 | Walker | B08B 5/02 134/104.2 |
| 6,507,000 B2 * | 1/2003 | Otsubo | B23K 26/1462 219/121.7 |
| 6,531,682 B1 * | 3/2003 | Guttler | B23K 26/147 219/121.84 |
| 6,621,045 B1 * | 9/2003 | Liu | B23K 26/1435 219/121.7 |
| 6,649,440 B1 * | 11/2003 | Krames | H01L 33/025 257/E33.067 |
| 6,664,504 B2 * | 12/2003 | Bertez | B23K 26/0608 219/121.84 |
| 6,664,507 B2 * | 12/2003 | Akaba | B23K 26/0604 219/130.5 |
| 6,797,919 B1 * | 9/2004 | Millard | B23K 26/123 219/121.84 |
| 6,847,005 B2 * | 1/2005 | Alfille | B23K 26/073 219/121.72 |
| 6,880,646 B2 * | 4/2005 | Batarseh | E21B 43/11 166/222 |
| 6,943,050 B2 * | 9/2005 | Kondo | H01L 27/1266 438/46 |
| 7,044,610 B2 * | 5/2006 | Beyer | B08B 15/04 347/22 |
| 7,138,293 B2 * | 11/2006 | Ouellet | B81C 1/00269 438/106 |
| 7,230,636 B2 * | 6/2007 | Iwasa | G03F 7/24 347/227 |
| 7,256,483 B2 * | 8/2007 | Epler | H01L 33/0093 257/676 |
| 7,300,337 B1 * | 11/2007 | Sun | B24B 23/02 451/295 |
| 7,465,945 B2 * | 12/2008 | Tokuda | G01N 23/225 250/492.1 |
| 7,506,792 B1 * | 3/2009 | Manfroy | B23K 1/0016 228/41 |
| 7,683,539 B2 * | 3/2010 | Kim | H01L 24/82 313/512 |
| 7,910,856 B2 * | 3/2011 | Koseki | B23K 26/146 219/121.67 |
| 7,947,919 B2 * | 5/2011 | Sukhman | B08B 7/0042 219/121.67 |
| 8,207,472 B2 * | 6/2012 | Kosmowski | B23K 26/16 219/121.67 |
| 8,273,587 B2 | 9/2012 | Basin et al. | |
| 8,274,735 B2 * | 9/2012 | Fry | G01N 21/71 359/393 |
| 8,426,227 B1 * | 4/2013 | Bibl | H01L 33/06 438/27 |
| 8,573,469 B2 * | 11/2013 | Hu | H01L 33/08 228/179.1 |
| 8,765,584 B2 * | 7/2014 | Kadowaki | B82Y 20/00 438/577 |
| 8,998,068 B2 | 4/2015 | Park et al. | |
| 9,035,279 B2 * | 5/2015 | Hu | H01L 24/83 257/13 |
| 9,190,400 B2 * | 11/2015 | Krasulick | H01L 25/167 |
| 9,259,802 B2 * | 2/2016 | Willey | A47L 9/2842 |
| 9,700,960 B2 * | 7/2017 | Jeong | B23K 26/362 |
| 2001/0024878 A1 * | 9/2001 | Nakamura | B24B 37/046 438/691 |
| 2002/0023907 A1 * | 2/2002 | Morishige | B23K 26/1462 219/121.85 |

(56) References Cited

U.S. PATENT DOCUMENTS

| | | | |
|---|---|---|---|
| 2002/0106869 A1* | 8/2002 | Otsu | H01L 21/6838 438/459 |
| 2002/0130116 A1* | 9/2002 | Lawson | B23K 26/142 219/121.84 |
| 2002/0157246 A1* | 10/2002 | Ogimoto | G02F 1/1303 29/832 |
| 2002/0192059 A1* | 12/2002 | Foster, Jr. | H01L 21/68728 414/403 |
| 2003/0001103 A1* | 1/2003 | Kobayashi | G03F 7/707 250/440.11 |
| 2003/0037804 A1* | 2/2003 | Erdmann | B23K 1/018 134/9 |
| 2003/0211813 A1* | 11/2003 | Kassir | B24B 37/30 451/28 |
| 2004/0140300 A1* | 7/2004 | Yoshikawa | B23K 26/147 219/121.84 |
| 2004/0226927 A1* | 11/2004 | Morikazu | B23K 26/142 219/121.84 |
| 2005/0016970 A1* | 1/2005 | Bayer | B23K 26/348 219/121.46 |
| 2005/0061378 A1* | 3/2005 | Foret | F04F 5/04 137/888 |
| 2005/0064137 A1* | 3/2005 | Hunt | B23K 26/55 428/131 |
| 2005/0269582 A1* | 12/2005 | Mueller | C04B 35/64 257/94 |
| 2006/0105485 A1* | 5/2006 | Basin | G02B 19/0028 438/27 |
| 2006/0172031 A1* | 8/2006 | Babbs | B82Y 40/00 425/385 |
| 2006/0172553 A1* | 8/2006 | Choi | H01L 21/6831 438/780 |
| 2006/0202223 A1* | 9/2006 | Sackrison | H01L 33/22 257/99 |
| 2006/0222481 A1* | 10/2006 | Foree | C23C 16/45521 414/800 |
| 2006/0231853 A1* | 10/2006 | Tanaka | H01L 33/486 257/99 |
| 2006/0281203 A1* | 12/2006 | Epler | H01L 33/0093 438/22 |
| 2007/0056941 A1* | 3/2007 | Murase | B23K 26/142 219/121.84 |
| 2007/0107252 A1* | 5/2007 | Kruckenhauser | B41N 1/12 34/402 |
| 2007/0118246 A1* | 5/2007 | Suzuki | H01L 21/6838 700/218 |
| 2007/0145026 A1* | 6/2007 | Murase | B23K 26/16 219/121.84 |
| 2007/0202623 A1* | 8/2007 | Gao | H01L 33/0093 438/29 |
| 2007/0210045 A1* | 9/2007 | Aso | B23K 26/1476 219/121.71 |
| 2008/0041832 A1* | 2/2008 | Sykes | B23K 26/146 219/121.84 |
| 2008/0067160 A1* | 3/2008 | Suutarinen | B23K 26/123 219/121.86 |
| 2008/0087640 A1* | 4/2008 | Miyairi | B23K 26/142 216/65 |
| 2008/0210675 A1* | 9/2008 | Sasaki | B23K 26/16 219/121.84 |
| 2008/0213978 A1* | 9/2008 | Henry | B08B 7/0092 438/462 |
| 2008/0251504 A1* | 10/2008 | Lu | B23K 26/0608 219/121.64 |
| 2009/0068598 A1* | 3/2009 | Murase | B23K 26/40 430/311 |
| 2009/0175705 A1* | 7/2009 | Nakao | H01L 21/67098 414/196 |
| 2009/0188901 A1* | 7/2009 | Dantus | B23K 26/0853 219/121.76 |
| 2009/0230409 A1* | 9/2009 | Basin | H01L 24/97 257/88 |
| 2009/0285991 A1* | 11/2009 | Kitano | G03F 7/162 427/346 |
| 2009/0294412 A1* | 12/2009 | Kono | B23K 26/032 219/121.6 |
| 2010/0013169 A1* | 1/2010 | Monteen | H01L 21/6838 279/3 |
| 2010/0175828 A1* | 7/2010 | Fan | H01L 21/6838 156/718 |
| 2010/0269853 A1* | 10/2010 | Johnston | B23K 26/364 134/1.1 |
| 2010/0282727 A1* | 11/2010 | Kobayashi | B23K 26/0613 219/121.71 |
| 2010/0309566 A1* | 12/2010 | DeWitt | G02B 17/084 359/729 |
| 2010/0320786 A1* | 12/2010 | Ko | H01L 21/6838 294/64.3 |
| 2011/0042874 A1* | 2/2011 | Aoki | G03F 7/70816 269/20 |
| 2011/0043784 A1* | 2/2011 | Aoki | G03F 7/707 355/72 |
| 2011/0053092 A1* | 3/2011 | Aoki | B65G 49/065 430/319 |
| 2011/0056921 A1* | 3/2011 | Belletti | B23K 26/1476 219/121.67 |
| 2011/0076118 A1* | 3/2011 | Kurita | H01L 21/67259 414/217 |
| 2011/0223696 A1 | 9/2011 | Basin et al. | |
| 2011/0241298 A1* | 10/2011 | Vodanovic | H01L 21/6838 279/3 |
| 2011/0253315 A1* | 10/2011 | George | H01L 21/6838 156/718 |
| 2012/0031147 A1* | 2/2012 | Arai | B23K 26/364 65/182.2 |
| 2012/0176600 A1* | 7/2012 | Falk | G01N 21/65 356/51 |
| 2012/0181454 A1* | 7/2012 | Kubota | B41J 2/442 250/492.1 |
| 2012/0225568 A1* | 9/2012 | Izawa | C03C 23/0025 438/795 |
| 2012/0241649 A1* | 9/2012 | Nishihara | H05G 2/008 250/504 R |
| 2013/0171831 A1* | 7/2013 | Namba | H01L 21/30604 438/748 |
| 2013/0221393 A1* | 8/2013 | Mao | H01L 33/44 257/98 |
| 2013/0277999 A1* | 10/2013 | Schaller | H01L 21/6838 294/186 |
| 2013/0330865 A1* | 12/2013 | Zhu | H01L 33/22 438/29 |
| 2013/0333722 A1* | 12/2013 | Tanaka | B08B 3/003 134/1 |
| 2014/0026351 A1* | 1/2014 | Willey | B08B 5/02 15/300.1 |
| 2014/0097162 A1* | 4/2014 | Jeong | B23K 26/361 219/121.68 |
| 2014/0272322 A1* | 9/2014 | Lee | B05B 12/20 428/192 |
| 2014/0299582 A1* | 10/2014 | Mizuno | B23K 20/02 219/78.02 |
| 2015/0118777 A1* | 4/2015 | Seo | H01L 33/20 438/34 |
| 2017/0274474 A1* | 9/2017 | Nie | B23K 26/0006 |
| 2018/0261715 A1* | 9/2018 | Nie | B23K 26/702 |

FOREIGN PATENT DOCUMENTS

| | | |
|---|---|---|
| JP | 2003-294900 A | 10/2003 |
| JP | 2011-512256 A | 4/2011 |
| JP | 2012121073 A | 6/2012 |
| JP | 2012-191112 A | 10/2012 |
| JP | 2013-184189 A | 9/2013 |
| JP | 2014-121718 A | 7/2014 |
| JP | 2014124648 A | 7/2014 |
| JP | 2015-199094 A | 11/2015 |

(56) References Cited

FOREIGN PATENT DOCUMENTS

| KR | 20090089161 A | 8/2009 |
|---|---|---|
| WO | 2009/104886 A2 | 8/2009 |
| WO | 2016/027186 A1 | 2/2016 |

OTHER PUBLICATIONS

Kelly et al., "Optical Process for Liftoff of Group III-Nitride", Physica Status Solidi, Rapid Research Note, Walter Schottky Insitut, Technische Universitat Muchen, Nov. 28, 1996, pp. 1-2.

* cited by examiner

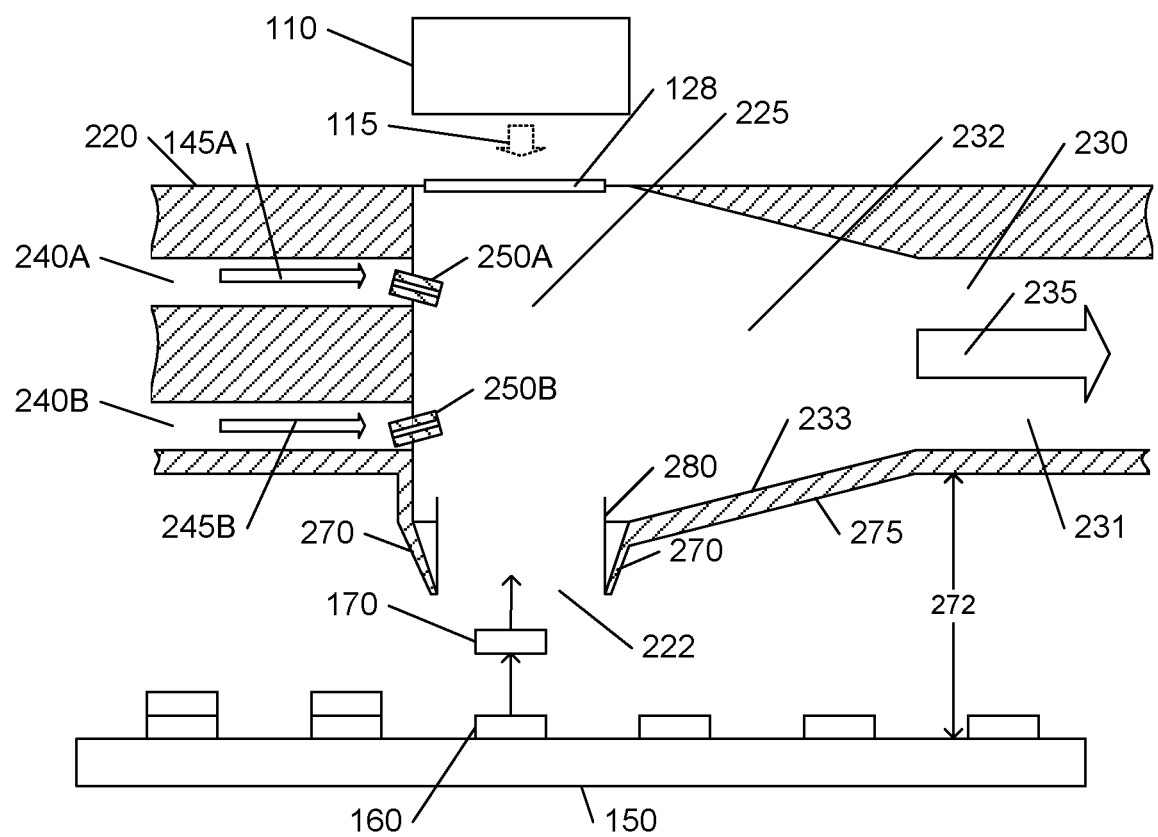
FIG. 2A
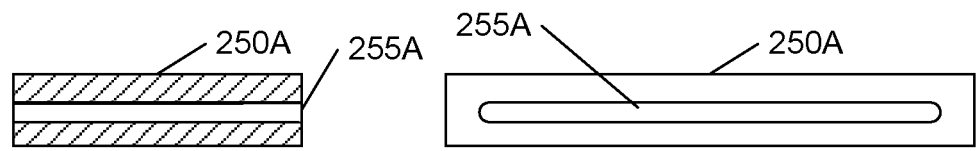
FIG. 2B
FIG. 2C

SAPPHIRE COLLECTOR FOR REDUCING MECHANICAL DAMAGE DURING DIE LEVEL LASER LIFT-OFF

CROSS-REFERENCE TO RELATED APPLICATIONS

The present application is a § 371 application of International Application No. PCT/IB2015/055712 filed on Jul. 29, 2015 and entitled "SAPPHIRE COLLECTOR FOR REDUCING MECHANICAL DAMAGE DURING DIE LEVEL LASER LIFT-OFF," which claims the benefit of U.S. Provisional Patent Application No. 62/038,988, filed Aug. 19, 2014. International Application No. PCT/IB2015/055712 and U.S. Provisional Patent Application No. 62/038,988 are incorporated herein.

FIELD OF THE INVENTION

This invention relates to the field of light emitting devices, and in particular to a system that reduces damage to the light emitting devices during laser lift-off of the sapphire substrate upon which the light emitting element is grown.

BACKGROUND OF THE INVENTION

Semiconductor devices, including semiconductor light emitting elements, are formed/grown on a substrate, sapphire wafer substrates being common. In the example of a light emitting element, a GaN nucleation layer may be formed on a sapphire substrate, followed by one or more n-type layers, one or more active layers, and one or more p-type layers. Metallic conductors may be formed through and upon the layers to provide coupling of the n-type and p-type layers to an external source of power to activate the active layer(s) of the light emitting element, via contact pads above the uppermost (p-type) layer.

Because the metallic contact pads are generally opaque or reflective, the light emitting element is designed to emit lights from the surface opposite the contact pads and through the substrate. To improve light extraction efficiency, the substrate may be removed, exposing the semiconductor surface. The semiconductor surface may be processed to further enhance the light extraction efficiency. In some cases one or more contact pads may be placed on the light emitting side of the device.

Laser lift-off is a process that is commonly used to remove the sapphire substrate from the light emitting element. A laser pulse is projected through the sapphire substrate and is absorbed by the semiconductor layer at the Sapphire-semiconductor interface, producing a localized explosive shockwave, due to the instant thermal decomposition of the semiconductor layer at the interface.

If the laser lift-off (LLO) is performed at the wafer level, the wafer-size sapphire substrate is removed after the whole wafer has been processed. If, on the other hand, the laser lift-off is performed for each individual die, the dies are flip-chip mounted on a sub-mount tile, with the sapphire facing upward. The laser is applied to each die, and the die-size sapphire chips pop up into a "Sapphire Collector", or "Confetti Catcher" immediately after the laser is incident on each die, leaving the semiconductor structure on the sub-mount tile. The sub-mount tile is subsequently processed to create, for example, lens elements over each die, then sliced/diced to provide the individual light emitting devices.

Between the time that the sapphire is removed and the dies are covered, the relatively fragile semiconductor surface is exposed, and susceptible to mechanical damage. During an example set of production runs, the yield lost to such mechanical damage has been measured to be about 0.236%.

SUMMARY OF THE INVENTION

It would be advantageous to reduce the likelihood of mechanical damage to a light emitting element after laser lift-off.

To better address this concern, in an embodiment of this invention, one or more features, both structural and parametric, are included in a Sapphire Collector (SC) for capturing the die-size sapphire chips that are removed from a semiconductor structure during die-level laser lift-off (LLO). These features are designed to increase the likelihood that each sapphire chip is securely captured by the Sapphire Collector immediately after it is released from the semiconductor structure. The Sapphire Collector includes a vacuum-enhance collector with a pickup element that lifts each released chip into the collector, and air pushers that direct the chips further into the collection tunnel leading to a discard bin.

In embodiments of this invention, the features that enhance the likelihood of a released sapphire chip being securely captured by the Sapphire Collector include one or more of the following.

To reduce the likelihood of the chip striking a top surface of the collector and bouncing back exiting the pickup element, an angled air pusher may be situated near the top of the collector to direct the chips away from the top surface and farther into the collection tunnel. At the same time, a complementary angled air pusher may be situated near the bottom of the collector to also direct the picked-up chips farther into the collection tunnel, and further direct any ricocheted chips away from the pickup element. To further enhance the efficiency of these air pushers, the air pushers may be shaped as air knives with high velocity, low volume output.

The entry to the collection tunnel may be flared to maximize the collection cross-section area, and to reduce the likelihood of a chip ricocheting back toward the pickup area. A trench may be created around the interior of the pickup element, to prevent any chips that manage to slide out of the flared tunnel opening, or otherwise coming near to the pickup element from exiting the pickup element.

The exterior surface of the collector facing the dies on the sub-mount may be chamfered, to reduce the likelihood of a 'wild chip' ricocheting repeatedly between the sub-mount and the lower surface of the collector. The pickup element, and the provided vacuum may also be designed to optimize the likelihood that a released chip will be forced to enter the collector.

In an example embodiment of this invention, the yield loss due to mechanical damage after laser lift-off was reduced by an order of magnitude, from 0.236% to 0.023%.

BRIEF DESCRIPTION OF THE DRAWINGS

The invention is explained in further detail, and by way of example, with reference to the accompanying drawings wherein:

FIGS. 2A-2C illustrate an example embodiment of a Sapphire Collector that substantially reduces the likelihood of mechanical damage to the light emitting element after laser lift-off.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 1A:
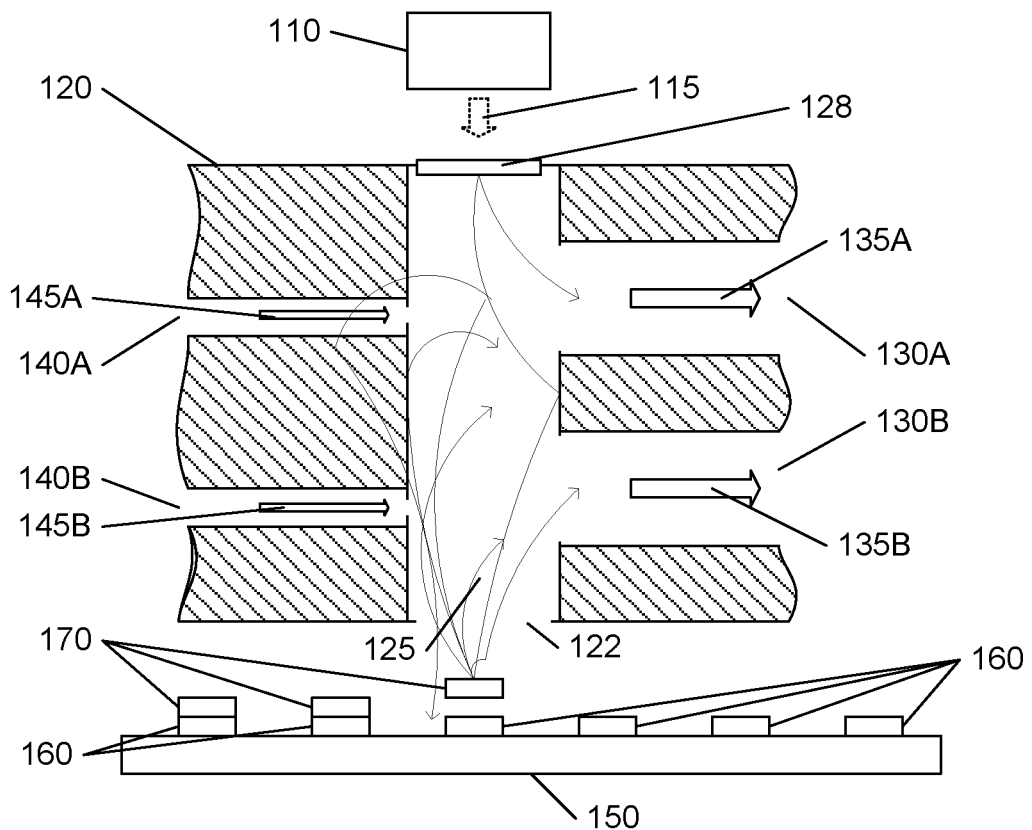
FIG. 1A illustrates an example prior art Sapphire Collector.

FIG. 1A illustrates an example prior art Sapphire Collector (SC) 120. The SC 120 includes a collection cavity 125 that is open to two tunnels 130A and 130B. These tunnels 130 are under negative pressure, causing vacuum flows 135A and 135B in tunnels 130A and 130B respectively. The SC 120 also includes input pipes 140A and 140B to the cavity 125 that provides a pressure flows 145A and 145B in pipes 140A and 140B respectively. Additional tunnels and pipes may also be provided.

A laser element 110 provides a pulsed laser beam 115 that enters SC 120 via a gate 128. The gate 128 is designed so as not to block the laser beam 115, but to prevent the escape of any sapphire chips 170 after they enter the cavity 125. The gate 128 may be, for example, a lens element, or simply a grate.

Below the SC 120, a plurality of light emitting elements 160 with attached sapphire substrate chips 170 are mounted on a submount 150. During laser lift-off, the SC 120 is situated over a light emitting element 160 with an attached sapphire chip 170, either by moving SC 120 relative to the submount 150, or moving the submount 150 relative to the opening 122 to the cavity 125 of SC 120.

With the light emitting element 160 and chip 170 situated beneath the opening 122, the pulsed laser beam 115 is applied, causing the chip 170 to be explosively released from the light emitting element 160. The upward force causes the released chip 170 to enter the opening 122 and the vacuum flows 135A and 13B causes it to travel toward the tunnels 130A and 130B. The pressurized air flows 145A and 145B exiting the pipes 140A and 140B also serve to push the traveling chip 170 toward the tunnels 130.

Depending upon the initial liftoff trajectory direction and velocity of the chip 170 relative to the vacuum 130 and pressurized air 145, the chip 170 may enter one of the vacuum tunnels 130 directly, or after a few ricochets. Ideally, even if the chip 170 ricochets around within the cavity 125, the chip 170 will eventually enter one of the tunnels 130A, 130B because its velocity will be continually decreasing, and thus increasingly more influenced by the vacuums 135A, 135B and pressurized air flows 145A, 145B.

The inventors have recorded the laser lift-off operation with respect to the submount 150 and the opening 122 using a high speed camera, and have observed that some chips 170 exit the opening 122 and cause damage.

Figure 1B:
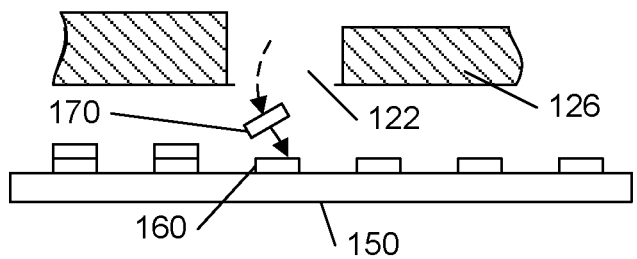
FIGS. 1B and 1C illustrate examples of adverse travel of a sapphire chip in the prior art Sapphire Collector of FIG. 1A.

In some cases, the chips 170 are hovering below the opening 122 and are eventually sucked back into the cavity 125, causing no adverse effects. In other cases, however, the chips 170 are traveling at a sufficient downward speed that the vacuum flows 135A, 135B and pressurized air flows 145A, 145B is insufficient to reverse or alter its direction before it exits the opening 122 and strikes the submount 150, as illustrated in FIG. 1B. The likely cause of this downward travel is a ricochet of the chip 170 off the walls or top surface of the cavity 125. Most ricocheting chips 170 are likely to eventually be sucked into the tunnels 130A, 130B, due to the vacuum flows 135A, 135B and the pressurized air flows 145A, 145B, but some chips 170 escape through the opening 122 and strike the sub-mount 150 with mounted light emitting elements 160.

If the exiting chip 170 strikes the submount 150 at a location where the light emitting element 160 is situated without an attached sapphire chip 170 (i.e. elements 160 with chips 170 laser removed), even at a low speed, the fragile nature of the semiconductor surface will likely result in the ruin of the element 160.

Figure 1C:
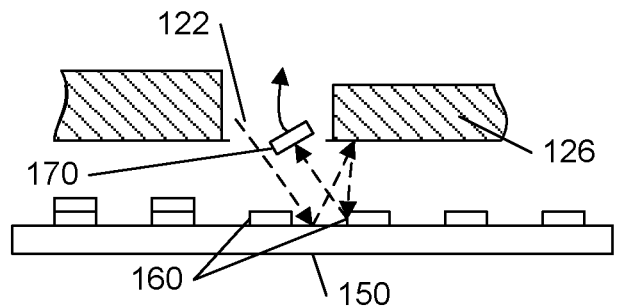

FIG. 1C illustrates an observed failure mechanism wherein the exiting chip 170 ricochets repeatedly between the lower exterior surface 126 of SC 120 and the submount 150, causing substantial damage, often to multiple elements 160 on the submount 150.

As noted above, the yield loss due to mechanical damage after laser lift-off has been observed in one set of production runs to amount to 0.236%; and, as subsequently been determined, most (90%) of this lost yield is due to the damage that exiting chips 170 inflict. It was also observed that a substantial majority of damage was produced due to the repeated ricochets illustrated in FIG. 1C.

FIG. 2A illustrates an example embodiment of a Sapphire Collector (SC) 220 that substantially reduces the likelihood of mechanical damage to the light emitting element after laser lift-off.

Of particular note, SC 220 includes a single tunnel 230, with a tubular portion 231 and a flared portion 232. A narrow end of the flared portion 232 is connected to tubular portion 231 and a wide end is connected to a cavity 225. Flared portion 232 may be a conic section, such as a cone shape with a pointed end removed. Both the flared portion 232 and the tubular portion 231 may have a circular cross section, or the shapes may be more complex. For example, flared portion 232 may have a rectangular cross section at its wide end, where it opens into the cavity 225, and a circular cross section at its narrow end, where it couples to the tubular portion 231. In the alternative, the cross sections for the either the flared portion 232 or the tubular portion 231 may have any suitable cross section e.g. square, triangular, elliptical. Likewise cavity 225 may have a rectangular cross section, a round cross section or any suitable cross section. The cross section of cavity 225 may be the same along its entire height or it may differ.

The tunnel 230 is held at negative pressure, resulting in a vacuum force or vacuum flow 235. Although this wider tunnel 230 may require a greater vacuum force 235 than the narrower tunnels 130A, 130B of FIG. 1, features that reduce the loss of the created vacuum may be provided, as detailed further below.

A laser element 110 provides a pulsed laser beam 115 that enters SC 220 via a gate 128. The gate 128 is designed so as not to block the laser beam 115, but to prevent the escape of any sapphire chips 170 after they enter the cavity 225. The gate 128 may be, for example, a lens element, or simply a grate.

Below the SC 220, a plurality of light emitting elements 160 with attached sapphire substrate chips 170 are mounted on a submount 150. During laser lift-off, the SC 220 is situated over a light emitting element 160 with an attached sapphire chip 170, either by moving SC 220 relative to the submount 150, or moving the submount 150 relative to the opening 222 to the cavity 225 of SC 220.

With the light emitting element 160 and chip 170 situated beneath the opening 222, the pulsed laser beam 115 is applied from laser source 110, causing the chip 170 to be explosively released from the light emitting element 160.

Although cavity 225 is shown as having a single side connected to tunnel 230 and a flat side opposite the connection to tunnel 230, other configurations are contemplated and are included within the scope of the invention. Cavity 225 may have a circular cross section or any other suitable cross section e.g. square, triangular, elliptical. Cavity 225 may be formed of any suitable combination of cross sections e.g. a cylindrical portion next to the laser 110 and a square cross section near wafer 150.

SC 220 includes two angled nozzles, or air pushers 250A and 250B, collectively air pushers 250, that couple the pipes 240A and 240B to the cavity 225, and may protrude into the cavity 225. These pipes 240A, 240B direct pressure flows 245A and 245B into the cavity 225 via the air pushers 250A, 250B. One of the air pushers 250A is situated near the top of the cavity 225, and is angled downward i.e. toward the opening 222, to reduce the likelihood that the released chip 170 will strike and ricochet from a top surface of the cavity 225 and/or reduce the likelihood that ricocheting chips will be directed toward the pickup opening 222. Another air pusher 250B is situated near the bottom of the cavity 225, and is angled upward i.e. away from opening 222, to direct the chip 170, or any ricocheting chips 170 into the flared portion 232, further reducing the likelihood that ricocheting chips 170 will be directed toward the pickup opening 222.

The air pushers 250A, 250B may be shaped as air knives that have volume shaped as a parallelepiped with a thin but long opening/slits 255A, 255B (not shown in FIG. 2A) into the cavity 225, as illustrated in FIG. 2B (side view, cross-section of 250A), and FIG. 2C (front view of 250A). The air knives may extend across the inner surface of the cavity 225, and direct the flows 240A, 240B through the narrow slits 255A, 255B toward the flared portion 232, thereby creating high velocity laminar air flows in the cavity 225. These laminar flows of air create shearing layers that minimizes the likelihood of a chip 170 passing through the shearing layers, and in particular, the likelihood of ricocheting chips 170 passing through both shearing layers without being directed toward the flared portion 232. The thin openings 255A, 255B of the air knives 250A, 250B also limits the volume of air that enters the cavity 225, thereby reducing loss of vacuum pressure 235 within the cavity 225, and increasing the vacuum force at the pickup opening 222 of SC 220. Although this example air knife has a rectangular cross section with a slit shaped as a milled rectangle, other suitable shapes for the air knife and the slit are contemplated, such as a plurality of orifices arranged in a line, and are included within the scope of the invention.

Because of the air knife shape of the air pushers 250A, 250B, most of the chips 170 will generally enter the flared portion 232, particularly ricocheting chips 170 whose speed continually decrease with each ricochet. However, some chips 170 may land on the sloped wall 233. Because these chips 170 are out of the primary airflow into the tunnel 230, there may not be enough of a vacuum force to pull the chips 170 up the sloped wall 233, and some of the chips 170 may slide down toward the pickup opening 222. To prevent these chips from falling out of the pickup opening 222, a barrier 280 may be placed around the pickup opening 222, forming a trench wherein the chips 170 are contained. Means may be provided for periodically removing the captured chips 170 from the trench formed by the barrier 280.

The exterior of SC 220 may be shaped to reduce the likelihood of extensive damage due to a ricocheting chip 170, such as illustrated in FIG. 1C. Of particular note, the pickup opening 222 may be formed by sloped walls 270 that serve to substantially deflect a ricocheting chip 170, minimizing the chance of the repetitious ricochet pattern of FIG. 1C. In like manner, the lower structure 275 may be sloped to further prevent a repetitious ricochet pattern.

In an embodiment of this invention, the amount of vacuum force 235 and pressure force 245 may be adjustable to provide an optimal air flow for the particular size and shape of the sapphire chips 170 that are being lifted off. In like manner the height 272 of SC 220 above the substrate 150 may be adjustable to optimize the airflow into the opening 222, while at the same time being as high as practical over the submount 150, to avoid damage by chips 170 that exit the opening 222 at low velocity and are sucked back into the opening 222 before they strike an exposed semiconductor 160. This elevated height also serves to reduce the force with which a falling chip 170 may strike the submount 150, by increasing the time that the falling chip 170 is exposed to the vacuum forces in the opposite direction.

Figure 3A:
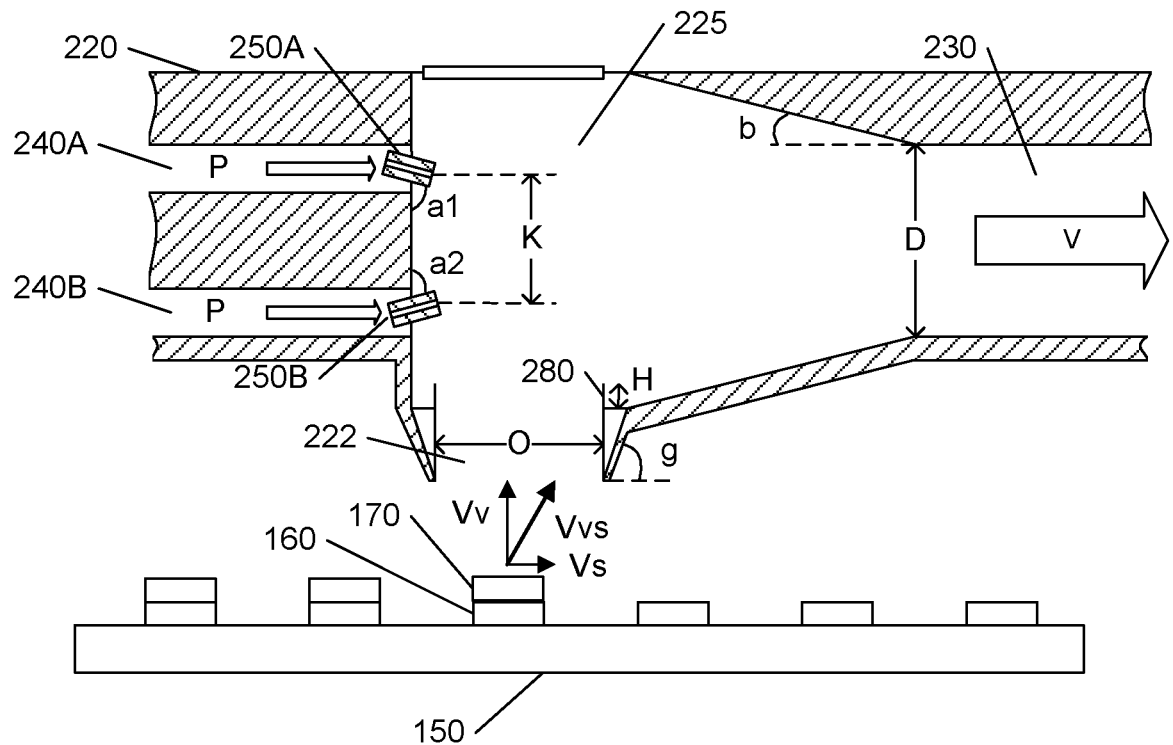
FIGS. 3A-3C illustrates example dimensions of the Sapphire Collector of FIG. 2.
Figure 3B:
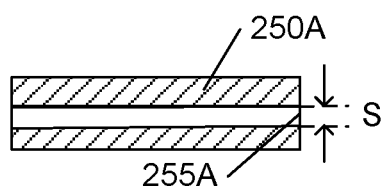
Figure 3C:
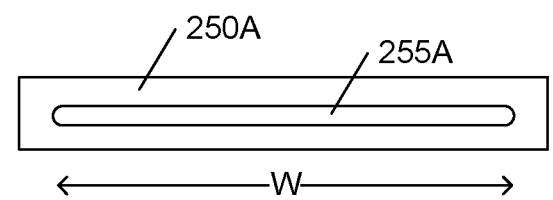

FIG. 3 illustrates example dimensions of the Sapphire Collector of FIG. 2, and Table 1 illustrates example values for each parameter or dimension.

TABLE 1

| Feature | Parameter | Example Value |
|---|---|---|
| Air Pushers 250 | Angles a1, a2 | ≤90°, adjustable |
| | Number of Pushers | ≥1 |
| | Slit thickness, S | 75 μm ± 25 μm |
| | Slit width, W | ≥10x chip size |
| Flared Vacuum Tunnel 230 | Taper angle, b | ≤45° |
| | Tunnel diameter, D | ≥ O; ≥ K |
| | Position | aligned with pushers 250 |
| Pickup Opening 222 | Opening width, O | as small as practical without blocking laser beam |
| | Opening shape | Square or rectangular |
| | Trench height, H | 1x ≤ H ≤ 3x chip size |
| Air Flow | Vacuum, V | <−6 kPa |
| | Pressure, P | >0.6 MPa |
| Exterior | Chamfer angle, g | >45° |
| | Wall thickness at tip | <1x chip size |
| Velocity | vacuum velocity, Vv staging velocity, Vs | Vector sum must point inside opening 222 |

As illustrated, the number of air pushers 250A, 250B may be equal to or greater than one. If only one air pusher 250A is provided, it may be situated near the top of the cavity 225, to prevent chips from ricocheting off the top of the cavity 225. If more than two air pushers 250A, 250B are provided, their orientation angles may be a continual change from angle a1 to angle a2.

Although the position of the tunnel is aligned with the pushers 250A, 250B, the alignment need only be approximate, and may be dependent upon the relative strengths of the pressure from the air pushers 250A, 250B and the vacuum in the tunnel 230. For example, if the vacuum force is great, so that most chips enter the tunnel 230 without an assist from the air pushers 250A, 250B, the air pushers 250A, 250B may be situated higher in the cavity 225, their function being primarily to redirect those chips that have a high vertical velocity toward the horizontal and into the tunnel 230.

To optimize production time, the submount 150 or the SC 220 is moved quickly to place each next semiconductor 160 with chip 170 beneath the opening 222. In some embodiments, the submount 150 travels at a varying velocity Vs due to acceleration and deceleration of stage movement, and the laser is activated when the semiconductor 160 with chip 170 is staged beneath the opening 222. The resulting velocity of the chip upon liftoff will be equal to the vector sum of the staging velocity Vs and the velocity induced by the vacuum Vv, including the initial velocity due to the laser separation of the chip 170 from the semiconductor 160. When the laser is activated, this vector sum Vvs must point into the opening 222. Accordingly, the opening 222 may be elongated (rectangular) to accommodate the offset produced by the lateral staging velocity Vs. In like manner, if SC 220 travels at velocity Vs and the submount 150 is held stationary, the opening 222 may also be elongated to accommodate the movement of SC 220. In some embodiments, the submount 150 is moved to place the next semiconductor 160 with chip 170 beneath the opening and stopped completely before the laser is activated.

The other parameters and dimensions in TABLE 1 are self explanatory to one of skill in the art and need no further details.

As noted above, high speed camera recordings have provided evidence that the yield loss using the aspects of this invention has been reduced by an order of magnitude, in one example, from 0.236% to 0.023%. Additionally, the rate of fallout (the number of chips that exit the pickup opening per the number of chips processed) has been reduced by well over an order of magnitude, from an average of 4.31% (25/580) to 0.24% (1.4/580).

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A collection system, comprising:
a container comprising:
a top surface defining a first opening,
a bottom surface defining a second opening,
a first side surface defining a third opening in a top half of the container and a fourth opening in a bottom half of the container,
a second side surface defining a fifth opening,
a cavity extending between the first opening and the second opening;
a first tunnel extending between the third opening and the cavity,
a second tunnel extending between the fourth opening and the cavity, and
a third tunnel extending between the fifth opening and the cavity;
a first nozzle at least partially in the first tunnel and angled toward the bottom surface of the container, the first nozzle having a slit formed therethrough, the slit having a thickness between 25 µm and 75 µm; and
a second nozzle at least partially in the second tunnel and angled toward the top surface of the container, the second nozzle having a slit formed therethrough, the slit having a thickness between 25 µm and 75 µm.

2. The collection system of claim 1, wherein the third tunnel comprises:
a first portion adjacent the fifth opening that has a uniform diameter, and
a second flared portion between the first portion and the cavity that has a diameter that tapers outward from the first portion toward the cavity and joins with the first opening in the top surface of the container and the second opening in the bottom surface of the container.

3. The collection system of claim 1, further comprising a chamfered pickup element, coupled to the cavity, that extends from the bottom surface of the container and includes sloped walls forming an opening through which chips enter the cavity, the sloped walls angling outward from the opening.

4. The collection system of claim 1, wherein the cavity is configured to receive chips that are released from a submount via laser liftoff.

5. The collection system of claim 1, wherein the first nozzle is angled toward the bottom surface of the container at an angle of ≤90° and the second nozzle is angled toward the top surface of the container at an angle of ≤90°.

6. The collection system of claim 1, wherein the first nozzle and the second nozzle each have a slit formed therethrough, and the slit has a thickness between 25 µm and 75 µm.

7. The collection system of claim 1, wherein the first tunnel is configured to receive an air flow during operation of the system, and the second tunnel is configured to be held in a vacuum during operation of the system.

8. The collection system of claim 7, wherein the air flow has a pressure >−0.6 Mpa during operation, and the vacuum is >−6 kPa during operation of the system.

9. A collection system comprising:
a container comprising:
a top surface defining a first opening,
a bottom surface defining a second opening,
a first side surface defining a third opening in a top half of the container and a fourth opening in a bottom half of the container,
a second side surface defining a fifth opening,
a cavity extending between the first opening and the second opening;
a first tunnel extending between the third opening and the cavity,
a second tunnel extending between the fourth opening and the cavity, and
a third tunnel extending between the fifth opening and the cavity;
a first nozzle at least partially in the first tunnel and angled toward the bottom surface of the container;
a second nozzle at least partially in the second tunnel and angled toward the top surface of the container; and
at least one of a lens and a grate over or in the first opening in the top surface of the container.

10. A collection system, comprising:
a container comprising:
- a top surface defining a first opening,
- a bottom surface defining a second opening,
- a first side surface defining a third opening,
- a second side surface defining a fourth opening,
    - a cavity extending through the container between the first opening and the second opening
    - a first tunnel extending between the third opening and the cavity, and
    - a second tunnel extending between the fourth opening and the cavity, the second tunnel comprising:
        - a first portion adjacent the fourth opening that has a uniform diameter, and
        - a second flared portion between the first portion and the cavity that has a diameter that tapers outward continuously between the first section and the first opening in the top surface of the container and the second opening in the bottom surface of the container.

11. The collection system of claim 10, further comprising a chamfered pickup element, coupled to the cavity, that extends from an underside of the collector system and includes sloped walls forming an opening through which chips enter the cavity, the sloped walls angling outward from the opening.

12. The collection system of claim 10, wherein the diameter of the second flared portion tapers at an angle of ≤45°.

13. The collection system of claim 10, wherein the cavity is configured to receive chips that are released from a submount via laser liftoff.

14. The collection system of claim 10, wherein the uniform diameter of the first portion is greater than or equal to a width of the second opening.

15. The collection system of claim 10, wherein the second tunnel is configured to be held in a vacuum during operation of the system.

16. The collection system of claim 10, further comprising an air pusher, extended into the cavity, that provides an air flow into the cavity, the air pusher being located at least partially in the first tunnel in an upper half of the cavity opposite the second tunnel.

17. The collection system of claim 16, wherein the air pusher is angled toward the bottom surface of the container.

18. The collection system of claim 16, wherein the first side surface further defines a fifth opening in a lower half of the container, and the collection system further comprises:
- a third tunnel in the container extending between the fifth opening and cavity; and
- another air pusher, extended into the cavity, that provides another air flow into the cavity, said another air pusher being located at least partially in the third tunnel.

19. The collection system of claim 18, wherein the another air pusher is angled toward the top surface of the container.

20. The collection system of claim 18, wherein the uniform diameter of the first portion is greater than or equal to a distance between the air pusher and the another air pusher along an axis of the cavity.

* * * * *